United States Patent [19]

Oakley

[11] 4,328,576
[45] May 4, 1982

[54] WIDE BAND DEMODULATOR OF PHASE MODULATED SIGNALS

[75] Inventor: William S. Oakley, Fremont, Calif.

[73] Assignee: Itek Corporation, Lexington, Mass.

[21] Appl. No.: 129,156

[22] Filed: Mar. 10, 1980

[51] Int. Cl.³ .................. G01R 23/17; G02F 1/39; H03D 3/06; H04J 1/16

[52] U.S. Cl. ...................... 370/3; 250/208; 324/77 K; 329/137

[58] Field of Search ............ 370/13, 3, 12; 455/611; 324/77 K; 350/162 R, 162 SF; 250/578, 208; 329/137

[56] References Cited

U.S. PATENT DOCUMENTS

| | | | |
|---|---|---|---|
| 3,942,109 | 3/1976 | Crumly et al. | 324/77 K |
| 4,126,834 | 11/1978 | Coppock | 332/7.51 |
| 4,253,060 | 2/1981 | Chen | 324/77 K |

Primary Examiner—Thomas W. Brown
Attorney, Agent, or Firm—Homer O. Blair; Robert L. Nathans; Gerald H. Glanzman

[57] ABSTRACT

A wide band demodulator of phase modulated radio frequency signals is disclosed, wherein first and second sets of sonic waves are generated within a Bragg cell, one set being phase shifted with respect to the other set, together with means for directing a linear diffraction pattern of the light output of the Bragg cell at first and second phase displaced correlation masks, together with a first and second array of photodetectors which receive the integral of the light passing through associated masks, thereby to enable the simultaneous detection of a very large number of phase modulated signals on a real time basis, and wherein there is virtually no interference between channels and the need for a very large number of local oscillators is eliminated.

9 Claims, 2 Drawing Figures

WIDE BAND DEMODULATOR OF PHASE MODULATED SIGNALS

BACKGROUND OF THE INVENTION

It is often desirable to simultaneously monitor as many as 1,000 channels within a wideband phase modulated radio frequency environment. Sequential scanning to examine various channels one after the other results in arrays loss of time, which for example, in military environments can become a serious matter. Thus, the simultaneous demodulation of any or all phase modulated signals within 1,000 channels is highly desirable. It is also highly desirable to eliminate a large number of local I.F. oscillators associated with the channels, and additionally, to virtually eliminate interference between channels.

Thus, it is an object of the present invention to provide a relatively inexpensive demodulation system which immediately detects phase shifts in one or all of a large number of radio frequency channels in real time.

It is a further object of the present invention to provide a demodulation system wherein there is virtually no interference between channels and the need for a very large number of local oscillators is eliminated.

SUMMARY OF THE INVENTION

In accordance with a preferred embodiment of the present invention, phase shift keyed (PSK) signals are immediately detected and demodulated over a wide bandwidth using a two-channel Bragg cell having two sonic input transducers. A fixed temporal delay in the input channel of one cell portion generates a frequency dependent phase difference between the channels, or a fixed phase delay device independent of frequency can be utilized. A frequency versus phase plane produced by a Fourier transformation lens is imaged upon two masks which transmit different phase information to a pair of linear array photodetectors which provide frequency spectra for the input signals at two separate phase references. The output signals from the arrays are correlated to simultaneously produce a detection of the degree and direction of the phase shift of the input RF signals within all RF channels.

Other objects, features, and advantages of the present invention will become apparent upon the study of the following description taken in conjunction with the drawings, in which FIG. 1 illustrates a dual channel Bragg cell which produces a linear diffraction pattern upon a grating, and;

FIG. 2 schematically illustrates a presently preferred embodiment of the invention.

DETAILED DESCRIPTION

Figure 1:
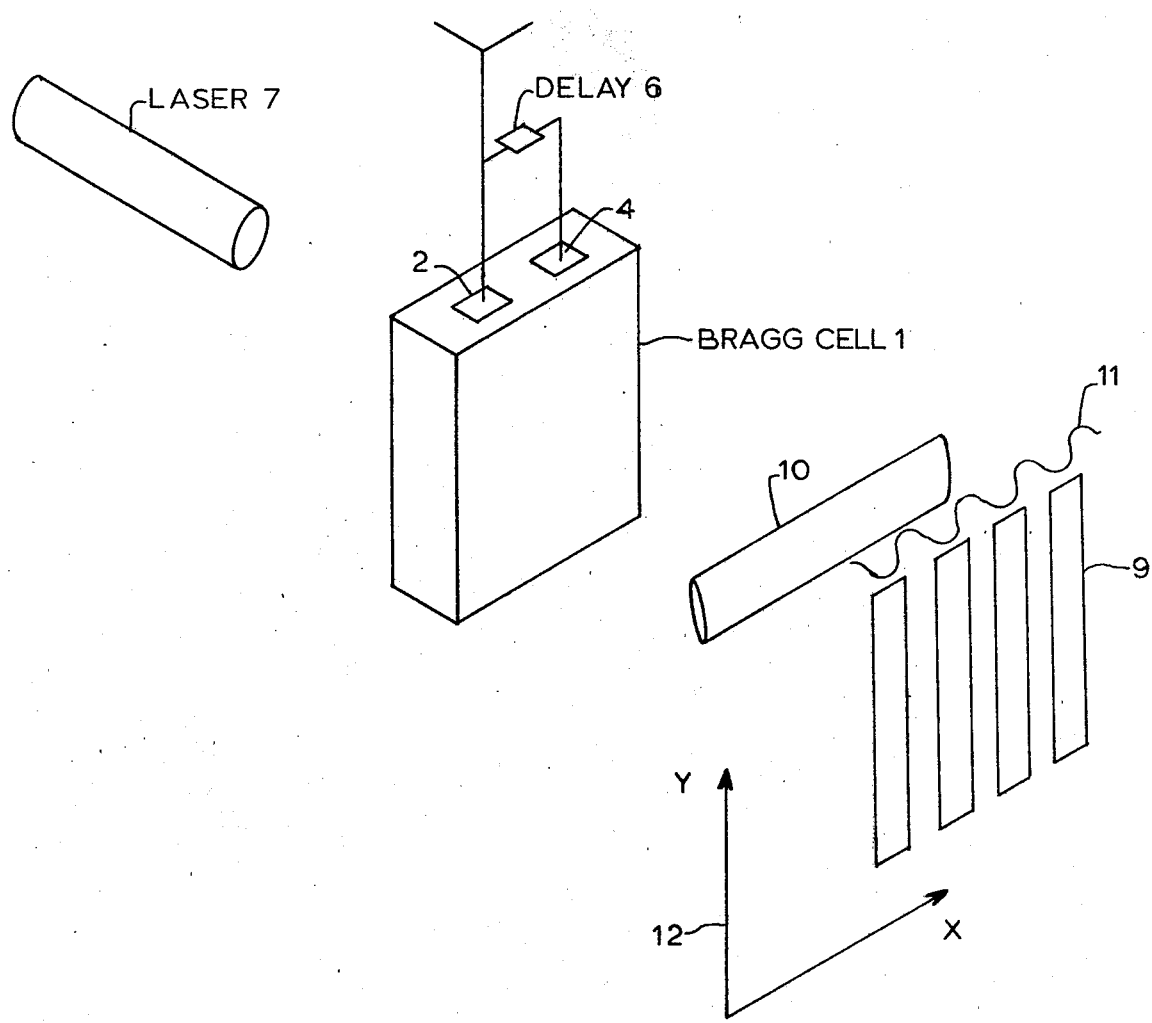

In FIG. 1, a dual-transducer Bragg cell has a first transducer 2 coupled to antenna 3, whereas a second transducer 4 is coupled to antenna 3 via delay means 6. The above mentioned coupling is effected via amplifiers and intermediate frequency demodulators as is well understood by those skilled in the art and hence the details have been omitted in the interest of clarity and brevity (see U.S. Pat. No. 3,942,109). However, such circuitry is schematically represented by hetrodyne means 20 in FIG. 2. Laser 7 illuminates Bragg cell 1 to produce a diffraction pattern which is diffracted to an extent depending upon the frequency of the sonic energy generated in Bragg cell 1, as is well understood by those skilled in the art. Reference may be made to U.S. Pat. No. 3,942,109, 3,962,577, 3,934,153, 4,052,121, and the references cited therein, for an explanation of various aspects of this phenomenon.

Owing to this arrangement, a diffraction pattern is produced in a manner analogous to the well-known twin-pinhole experiment of Young (see *University Physics*, by F. W. Sears and M. W. Zemansky, published by Addison Wesley, Copyright 1964, pages 898–903). A cylindrical Fourier transformation lens 10 produces a linear diffraction pattern across grating 9, as schematically indicated by pattern 11. Changes in the frequency of the acoustic waves set up in Bragg cell 1 produce a shift in the linear diffraction pattern 11 along the Y-axis, schematically illustrated by arrow 12. Should the light passing through the grating be intgrated by a demagnifying lens and focussed upon a photodetector, phase shifts in the x-direction (perpendicular to the orientation of the slits of grating 9) of diffraction pattern 11 will produce a changing sinusoidal signal at the output of the photodetector as explained below.

Figure 2:
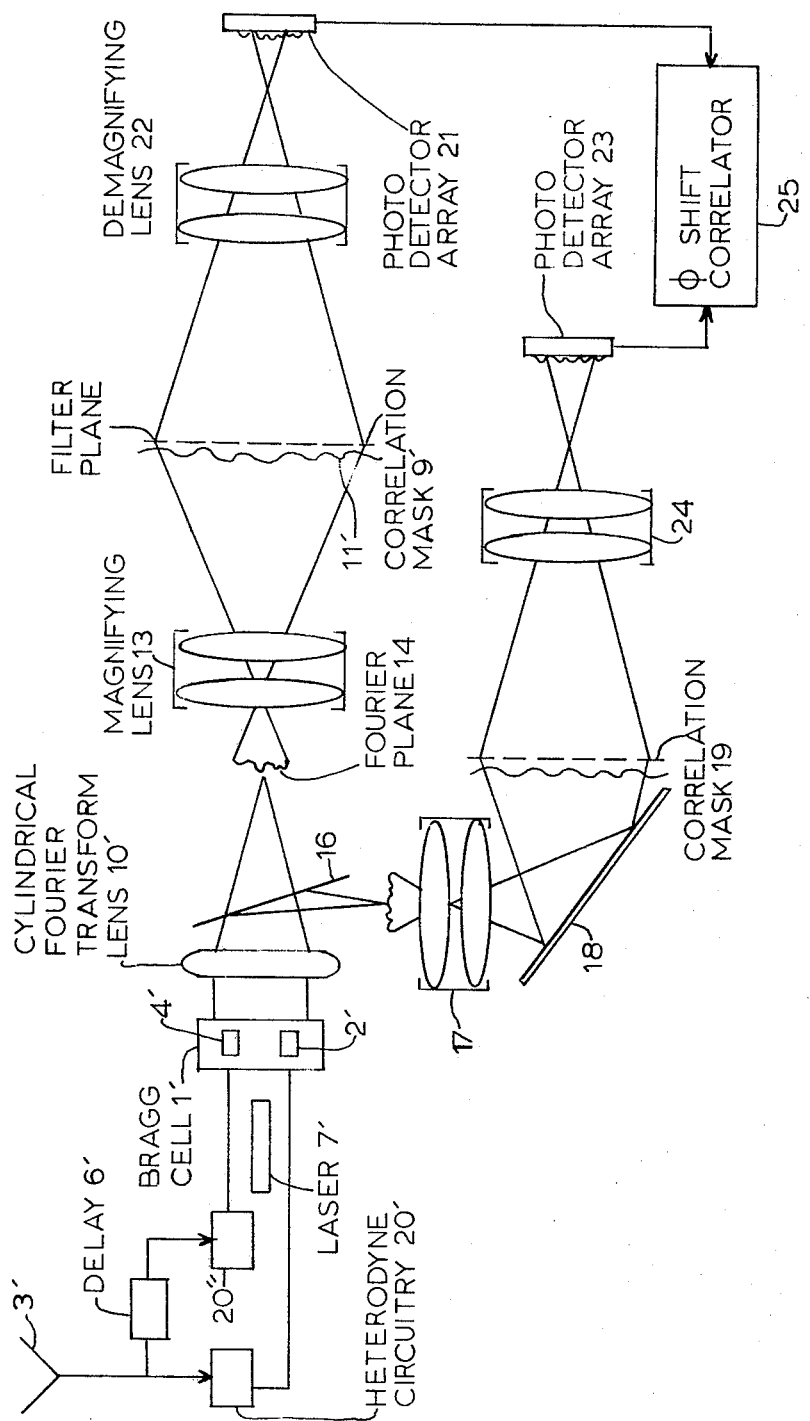

Referring now to FIG. 2, dual transducer Bragg cell 1' is illuminated by laser 7'. A first transducer 2' is coupled to antenna 3' via heterodyne circuitry 20', whereas a second transducer 4' is coupled to antenna 3' via circuitry 20'' and quarter-wave delay means 6'. The above-mentioned linear diffraction pattern 11' is produced at the filter plane, having grating 9' positioned therein, by virtue of cylindrical Fourier transformation lens 10' and magnifying lens 13. The Fourier plane is represented at position 14 in the figure. Beam splitter 16 in conjunction with lens system 17 and mirror 18 also produces the linear diffraction pattern in the filter plane of the second grating or correlation mask 19, which has the same spacing as the first grating or correlation mask 9'. However, the position of the second mask 19 with respect to the diffraction pattern is physically shifted $\frac{1}{4}$ (one quarter) cycle of the repetition period of the grid pattern. The optical signal in each channel is thus filtered by a pair of square wave correlation transmission masks after optical magnification of the primary Fourier transformation plane. The filtered signals are now imaged upon separate arrays of photodetectors 21 and 23 to produce quadrature measurements of the correlation function. First photodetector array 21 is positioned so as to integrate the light passing through first correlation mask 9' and demagnifying lens 22. In like manner, photodetector array 23 is positioned to integrate the light passing through second correlation mask 19, which also passes through a second demagnifying lens 24. Linear arrays 21 and 23 in the case of a 1,000 channel system, comprise 1,000 photodetectors which extend into the plane of FIG. 2. Each detector is coupled to a phase shift correlator 25, the details of which have been omitted since such a correlator is well-known by those skilled in the art. In other words, the output terminal of any particular photodetector in array 21 would be correlated within correlator 25 with an output terminal of a corresponding detector in array 23. As mentioned above, different carrier frequencies of the incoming RF signal will change the frequencies of the acoustic waves in the Bragg cell to diffract the light generated by laser 7' to an extent proportional to such frequency. Thus, the linear diffracting patterns will be positioned in Y, as previously explained, to thereby illuminate selected photodetectors in each linear array positioned along the Y-axis as a function of the RF carrier frequencies.

Now let it be assumed that an RF signal of a particular frequency shifts in phase. This action causes the non-delayed grating generated within the first Bragg cell channel due to the sonic wave to shift its position with respect to the delayed grating in the second channel, which in turn produces an x-direction shift of the intensity pattern at the filter planes, which is immediately detected by that particular pair of photodetectors which is associated with the RF carrier frequency being phase modulated. Such a shift is immediately outputted by phase shift correlator 25. Since the phase shift produces out-of-phase sine waves at the output terminals of said particular pair of photodetectors, and since the second correlation mask 19 is physically shifted out-of-phase with respect to the first correlation mask 15, both the extent and direction of such phase shift may be readily ascertained, by correlator 25 as is well understood by those skilled in the art. (See patents in Patent Office in Class 340-347 which includes analog to digital incremental shaft angle encoders employing phase readout photocells). On the other hand, the absence of any change in the phase of an incoming RF signal will not be indicated by the phase shift correlator 25.

It is important to note that since phase shift correlator 25 is simultaneously examining, for example, 1,000 channels, that the correlator may simultaneously produce demodulated signals proportional to the phase shifts occurring in up to 1,000 channels. Since there is little if any significant optical cross talk, there is virtually no interference between the channels. Owing to the above mentioned system, the elimination of numerous local I.F. oscillators may also be noted.

The preferred Bragg cell parameters are as follows: 500 MHz band width; 20% diffraction efficiency; 1 GHz center frequency; 40 dB dynamic range; and 2 microsecond aperture. The correlation masks 9' and 19 comprise commonly available sinusoidal or square wave masks of several dozen cycles. The photodetectors are commonly available 1,000 element self-scanned arrays. The preferred laser is of the continuous wave helium-neon type having a 2-mw average power at 632.8 m.

It should be understood that other components and configurations may be substituted for those described in order to practice the invention, and the invention is to be limited only by the permissable scope of the following claims. References are made in the claims to numbered components in the described embodiment, and it should be understood that the claims are not to be restricted to such embodiment, as the numbers employed in the claims are merely exemplary of the nature of the claimed means. For example, the term "Bragg cell" is intended to include any and all devices which broadly function in the manner of Bragg cells, regardless of what they are called.

I claim:

1. A wide band demodulator of phase modulated signals comprising:
   a. a Bragg cell (1') having a first transducer (2') for generating a first sonic wave in a first portion of said Bragg cell and a second transducer (4') for generating a second sonic wave in a second portion of said Bragg cell;
   b. first and second radio frequency channels, including heterodyne means (20', 20") coupled to said first and second transducers respectively;
   c. delay means (6') positioned in said second radio frequency channel for providing phase delay of said second sonic wave in said second cell portion with respect to the sonic wave produced by said first transducer within said first cell portion;
   d. light generating means (7') for illuminating said Bragg cell with coherent light;
   e. a first correlation mask (9');
   f. a second correlation mask (19) physically shifted in phase with respect to said first correlation mask;
   g. optical means (10', 16, 17, 18, 13) for producing linear diffraction patterns in planes of said first and second correlation masks as a function of the Fourier transform of the light emerging from said Bragg cell;
   h. a first linear array of photodetectors (21), each detector thereof being associated with a particular radio frequency band;
   i. a second linear array of photodetectors (23), each detector thereof being associated with a particular radio frequency band;
   j. first integrating means (22) for integrating the light passing through said first correlation mask and for projecting said light upon a given photodetector of said first linear array of photodetectors;
   k. second integrating means (24) for integrating the light passing through said second correlation mask and for projecting said light upon a given photodetector of said second linear array of photodetectors; and,
   l. phase shift correlator means (25) coupled to said first and second linear arrays of photodetectors for simultaneously detecting phase shifts between the output signals produced by the detectors of said first and second linear photodetector arrays.

2. The combination as set forth in claim 1 wherein said optical means for producing linear diffraction patterns at the planes of said first and second correlation masks includes a cylindrical Fourier transformation lens means, a first magnifying lens means optically coupled between said cylindrical lens means and said first correlation mask, and a second magnifying lens means optically coupled between said cylindrical lens means and said second correlation mask, for focusing similar linear diffraction patterns at the filter planes of said first and second correlation masks.

3. The combination as set forth in claim 2 further including a beam splitter positioned between said cylindrical lens means and said second magnifying lens means for directing light emerging from said cylindrical lens means through said second magnifying lens means.

4. The combination as set forth in any of claims 1, 2 or 3 wherein said first and second correlation masks are periodic transmission masks having a fundamental frequency equal to the sinusoidal frequency of said linear diffraction patterns.

5. A wide band demodulator for phase modulated signals comprising:
   a. Bragg cell means;
   b. light generating means for illuminating said Bragg cell means with coherent light;
   c. first and second photodetector means;
   d. means for generating a first sonic wave in a first portion of said Bragg cell means and for generating a second sonic wave in a second portion of said Bragg cell means which is delayed with respect to the said first sonic wave for generating a frequency dependent phase difference between said first and second sonic waves;

e. a first optical correlation means optically coupled to said first photodetector means;
f. a second optical correlation means optically coupled to said second photodetector means;
g. optical means for producing linear diffraction patterns in the filter planes of said first and second optical correlation means which are a function of the Fourier transform of the light emerging from said Bragg cell means; and
h. said second optical correlation means being in a phase shifted relationship with respect to said linear diffraction pattern and with respect to the physical position of said first optical correlation means.

6. The combination as set forth in claim 5 wherein said first and second photodetector means comprise a plurality of individual photodetectors, each of which is associated with a given frequency band of waves produced within said Bragg cell means.

7. A wide band demodulator for phase modulated signals comprising:
a. Bragg cell means;
b. light generating means for illuminating said Bragg cell means with coherent light;
c. first and second photodetector means;
d. means for generating a first sonic wave in a first portion of said Bragg cell means and for generating a second sonic wave in a second portion of said Bragg cell means which is delayed with respect to the said first sonic wave for generating a frequency dependent phase difference between said first and second sonic waves;
e. first correlation means optically coupled to said first photodetector means;
f. second correlation means optically coupled to said second photodetector means;
g. means for producing linear diffraction patterns in the filter planes of said first and second optical correlation means which are a function of the Fourier transform of the light emerging from said Bragg cell means; and
h. said second correlation means being in a phase shifted relationship with respect to said linear diffraction pattern.

8. The combination as set forth in claim 7 wherein said first and second photodetector means comprise a plurality of individual photodetectors, each of which is associated with a given frequency band of waves produced within said Bragg cell means.

9. A wide band demodulator for phase modulated signals comprising:
a. Bragg cell means;
b. light generating means for illuminating said Bragg cell means with coherent light;
c. first and second arrays of a large plurality of photodetectors;
d. means for simultaneously generating a large plurality of a first set of sonic waves having different frequencies in a first portion of said Bragg cell means and for simultaneously generating a large plurality of a second set of sonic waves having frequencies corresponding to said sonic waves of said first set in a second portion of said Bragg cell means which are delayed with respect to the said first set of sonic waves for generating a frequency dependent phase difference between said first and second sets of sonic waves;
e. first correlation means optically coupled to said first array of photodetectors;
f. second correlation means optically coupled to said second array of photodetectors;
g. means for producing linear diffraction patterns in the filter planes of said first and second optical correlation means which are a function of the Fourier transform of the light emerging from said Bragg cell means; and
h. said second correlation means being in a phase shifted relationship with respect to said linear diffraction pattern.

* * * * *